(12) United States Patent
Sekiya et al.

(10) Patent No.: US 6,697,002 B2
(45) Date of Patent: Feb. 24, 2004

(54) LOW-PASS FILTER

(75) Inventors: Mamoru Sekiya, Neyagawa (JP);
Youichi Kudoh, Neyagawa (JP);
Satomi Yamaguchi, Neyagawa (JP)

(73) Assignee: Onkyo Corporation, Neyagawa (JP)

( * ) Notice: Subject to any disclaimer, the term of this patent is extended or adjusted under 35 U.S.C. 154(b) by 0 days.

(21) Appl. No.: 10/342,205

(22) Filed: Jan. 15, 2003

(65) Prior Publication Data

US 2003/0132869 A1 Jul. 17, 2003

(30) Foreign Application Priority Data

Jan. 17, 2002 (JP) .................................... 2002-009176
Nov. 25, 2002 (JP) .................................... 2002-340528

(51) Int. Cl.$^7$ .............................................. H03M 3/00
(52) U.S. Cl. ...................................... 341/143; 341/144
(58) Field of Search ................................ 341/143, 144, 341/155; 327/552; 330/294

(56) References Cited

U.S. PATENT DOCUMENTS 4,306,201 A * 12/1981 Nakamura .................. 330/294
5,307,064 A    4/1994 Kudoh
6,008,691 A * 12/1999 Morita ........................ 327/552

FOREIGN PATENT DOCUMENTS

JP      05-276035      10/1993
JP      3134403        2/2001

* cited by examiner

Primary Examiner—Jean JeanGlaude
(74) Attorney, Agent, or Firm—Westerman, Hattori, Daniels & Adrian, LLP

(57) ABSTRACT

A low-pass filter (700) includes a differential operation circuit (2), a voltage-current conversion circuit (3), and a capacitor (C1). The voltage-current conversion circuit (3) and the capacitor (C1) form a filter circuit (700), and therefore the low-pass filter can remove a high frequency component. The differential operation circuit (2) outputs a differential signal ($\phi C$) for the difference between an analog signal ($\phi A$) and an output signal ($\phi B$). Therefore, with the differential operation circuit (2), a necessary frequency band is not attenuated. The phase level of the output signal ($\phi B$) output from the low-pass filter (700) can be substantially equal to that of the analog signal ($\phi A$) by the differential operation circuit (2). Therefore, the low-pass filter have a higher attenuation ratio for a high frequency component.

6 Claims, 13 Drawing Sheets

LOW-PASS FILTER

BACKGROUND OF THE INVENTION

1. Field of the Invention

The present invention generally relates to low-pass filters, and more particularly, to a low-pass filter for use in an audio apparatus.

2. Description of the Related Art

Conventionally, a digital signal input to an audio apparatus is converted into an analog signal by a digital analog converter (hereinafter referred to as "DAC") in the apparatus. The resulting analog signal has its high frequency component attenuated by a low-pass filter (hereinafter referred to as "LPF") in the audio apparatus and is then output from the apparatus.

FIG. 17 is a circuit diagram of the configuration of an LPF in a conventional audio apparatus.

Referring to FIG. 17, the LPF 200 includes resistance elements R201 and R202, capacitors C201 and C202, and an operational amplifier OP201. The resistance elements R201 and R202 are connected in series, and one end of the resistance element R202 is connected to the non-inverting input terminal of the operational amplifier OP201. An analog signal is input to the end of the resistance element R201 not connected to the resistance element R202. The capacitor C201 has its one end connected between the resistance elements R201 and R202 and its other end connected to the output terminal of the operational amplifier OP201. The capacitor C202 has its one end connected to the non-inverting input terminal of the operational amplifier OP201 and its other end connected to a ground potential node 201. The inverting input terminal of the operational amplifier OP201 is connected to the output terminal.

In order to improve the sound quality of the analog signal output from the audio apparatus, the LPF must sufficiently remove the high frequency component from the analog signal. This is because the high frequency component can be a cause of degradation of the sound quality.

FIG. 18 is a waveform chart of the analog signal output from the LPF 200. As shown in FIG. 18, the LPF 200 cannot completely remove the high frequency component from the analog signal.

In order to improve the sound quality, the high frequency component must be more thoroughly removed.

Japanese Patent No. 3,134,403 discloses the invention directed to improvement in the sound quality. According to the invention disclosed by the patent document, the waveform of the output signal is smoothed in order to improve the sound quality.

According to the invention disclosed by the document, however, the high frequency component cannot fully be removed. Therefore, the high frequency component that can be a cause of degradation of the sound quality must be more thoroughly removed.

SUMMARY OF THE INVENTION

It is an object of the present invention to provide an LPF having improved capability of removing the high frequency component.

A low-pass filter according to the invention attenuates a high frequency component of an input signal and outputs a low frequency component of the signal as an output signal. The low-pass filter includes differential operation circuit, voltage-current conversion circuit, and capacitance element. The differential operation circuit subtracts the output signal from the input signal and outputs a differential signal. The voltage-current conversion circuit converts voltage of the differential signal output from the differential operation circuit into current. The capacitance element accumulates charges in current received from the voltage-current conversion circuit, and generates the output signal.

In the low-pass filter according to the invention, the voltage-current conversion circuit and the capacitance element form a filter circuit, so that the high frequency component can be significantly attenuated. The differential operation circuit produces the difference between the input signal and the output signal and adds the difference to the output signal as required. Therefore, a necessary frequency component is not removed. As a result, a high sound quality can be secured.

The low-pass filter according to the invention preferably further includes first filter circuit. The first filter circuit attenuates a high frequency component of the differential signal output from the differential operation circuit and outputs a low frequency component of the differential signal to be supplied to the voltage-current conversion circuit.

The low-pass filter according to the invention includes the filter circuit after the differential operation circuit and can therefore have improved capability of removing the high frequency component. In addition, the necessary frequency band is not attenuated, because the quality factor can be raised and the attenuation in the passband gain in the frequency characteristic can be restrained.

The low-pass filter according to the invention preferably further includes second filter circuit. The second filter circuit attenuates a high frequency component of an input signal and outputs a low frequency component of the signal. The differential operation circuit subtracts the output signal from the low frequency component of the input signal output from the second filter circuit and outputs a differential signal.

In this way, the low-pass filter can have improved capability of removing the high frequency component, because the filter order can be increased and the slope characteristic can be steeper.

A low-pass filter according to invention attenuates a high frequency component of an input signal and outputs a low frequency component of the signal as an output signal. The low-pass filter includes differential operation circuit, sample and hold circuit, voltage-current conversion circuit, and capacitance element. The differential operation circuit subtracts the output signal from the input signal and outputs a differential signal. The sample and hold circuit samples and holds the differential signal output from the differential operation circuit. The voltage-current conversion circuit converts voltage output from the sample and hold circuit into current. The capacitance element accumulates charges in current received from the voltage-current conversion circuit and generates the output signal.

The low-pass filter according to the invention can sufficiently remove the high frequency component to be a cause of noise by the use of the sample and hold circuit. As a result, the high frequency component can sufficiently be removed, and the slope characteristic can be steep.

The sample and hold circuit preferably includes a plurality of sample and hold units and a switch circuit. The plurality of sample and hold units sample and hold the differential signal in different timings from each other. The switch circuit sequentially switches the outputs of the plurality of sample and hold units.

In this way, while one of the plurality of sample and hold units receives sampling instructions, the other sample and hold units do not receive any sampling instructions. As a result, when the sampling instruction period is shortened, the plurality of sample and hold units can carry out sampling, which improves the sampling accuracy. Since errors in sampling can be reduced and the sampling period can be shortened, the output waveform can be smooth.

A low-pass filter according to the invention includes first and second low-pass filter circuit. The first low-pass filter circuit attenuates a high frequency component of an input signal and outputs a low frequency component of the signal. The second low-pass filter circuit attenuates a high frequency component of the output signal of the first low-pass filter circuit and outputs a low frequency component of the signal. The first low-pass filter circuit includes first differential operation circuit, sample and hold circuit, first voltage-current conversion circuit, and first capacitance element. The first differential operation circuit subtracts the output signal of the first low-pass filter circuit from the input signal and outputs a differential signal. The sample and hold circuit samples and holds the differential signal output from the first differential operation circuit. The first voltage-current conversion circuit converts voltage output from the sample and hold circuit into current. The first capacitance element accumulates charges in current received from the first voltage-current conversion circuit and generates the output signal of the first low-pass filter circuit. The second low-pass filter circuit includes second differential operation circuit, second voltage-current conversion circuit, and second capacitance element. The second differential operation circuit subtracts the output signal of the second low-pass filter circuit from the output signal of the first low-pass filter circuit and outputs a differential signal. The second voltage-current conversion circuit converts voltage output from the second differential operation circuit into current. The second capacitance element accumulates charges in current received from the second voltage-current conversion circuit and generates the output signal of the second low-pass filter circuit.

The low-pass filter according to the invention includes the two low-pass filter circuit. The output signal of the first low-pass filter circuit is further removed of the high frequency component by the second low-pass filter circuit. The output signal of the first low-pass filter circuit can have a smoother waveform by the use of the second low-pass filter circuit.

DETAILED DESCRIPTION OF THE PREFERRED EMBODIMENTS

Figure 1:
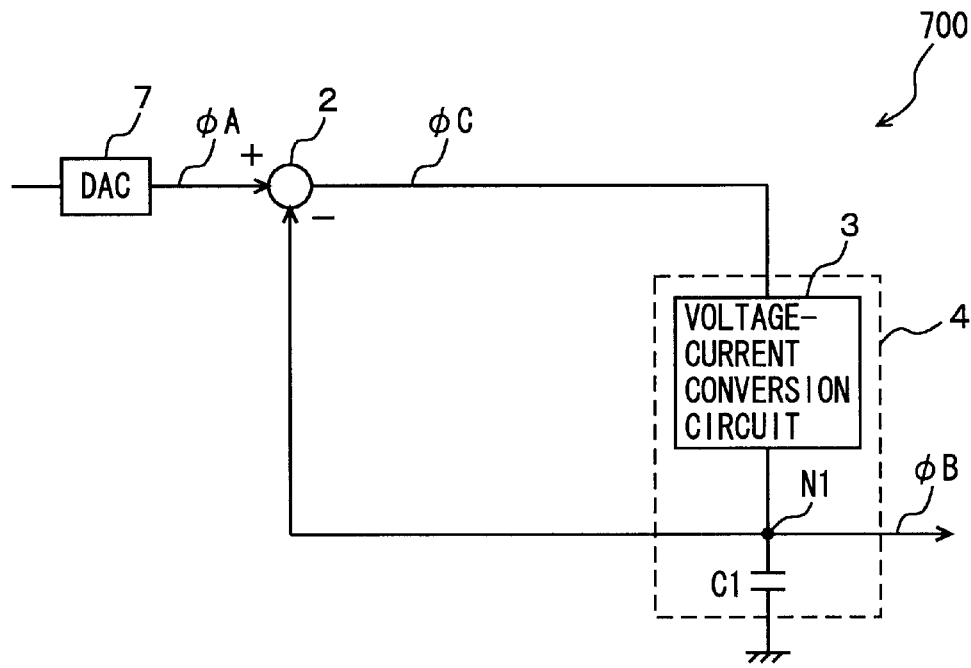
FIG. 1 is a circuit diagram of the configuration of an LPF according to an embodiment of the invention.

Now, embodiments of the invention will be described in detail in conjunction with the accompanying drawings, in which the same or corresponding portions are denoted by the same reference characters and their description is equally applied.

FIG. 1 is a functional block diagram of the configuration of an LPF according to an embodiment of the invention.

Referring to FIG. 1, the LPF 700 includes a differential operation circuit 2, a voltage-current conversion circuit 3, and a capacitor C1.

A DAC 7 converts an externally input digital signal into an analog signal $\phi A$. The differential operation circuit 2 obtains the differential value between the analog signal $\phi A$ output from the DAC 7 and an output signal $\phi B$ fed back from an output node N1. More specifically, the differential operation circuit 2 subtracts the output signal $\phi B$ from the analog signal $\phi A$ to output a differential signal $\phi C$.

The voltage-current conversion circuit 3 receives the output signal of the differential operation circuit 2 and converts the voltage value into a current value.

Figure 2:
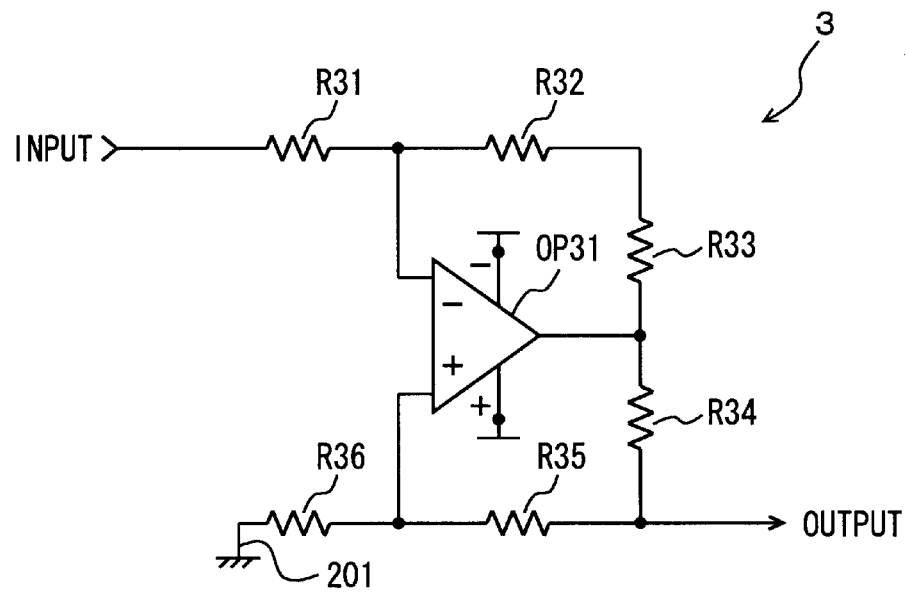
FIG. 2 is a circuit diagram of the configuration of the voltage-current conversion circuit shown in FIG. 1.

FIG. 2 is a circuit diagram of a typical voltage-current conversion circuit. Referring to FIG. 2, the voltage-current conversion circuit 3 includes resistance elements R31 to R36 and an operational amplifier OP31. The resistance element R31 has its one end connected to the inverting input terminal of the operational amplifier OP31, and its other end receives an output signal from the differential operation circuit 2. The resistance element R32 has its one end connected to the inverting input terminal of the operational amplifier OP31 and its other end connected to the resistance element R33. The resistance element R33 has its other end connected to the output terminal of the operational amplifier OP31. The resistance element R34 has its one end connected to the output terminal of the operational amplifier OP31 and its other end connected to the resistance element R35. The other end of the resistance element R35 is connected to the non-inverting input terminal of the operation amplifier OP31. The resistance element R36 has its one end connected to the non-inverting input terminal of the operational amplifier OP31 and its other end connected to a ground potential node 201.

The voltage-current conversion circuit 3 shown in FIG. 2 is a constant current circuit in which output resistance is equivalently raised by positive feedback.

Referring back to FIG. 1, the capacitor C1 has its one end connected to the voltage-current conversion circuit 3 at the node N1 and its other end connected to the ground potential node 201. The capacitor C1 is charged or discharged by current output from the voltage-current conversion circuit 3. The voltage-current conversion circuit 3 and the capacitor C1 form a filter circuit 4. The filter circuit 4 outputs the output signal φB from the output node N1.

Now, the operation of the LPF 700 in the above circuit configuration will be described.

Figure 3:
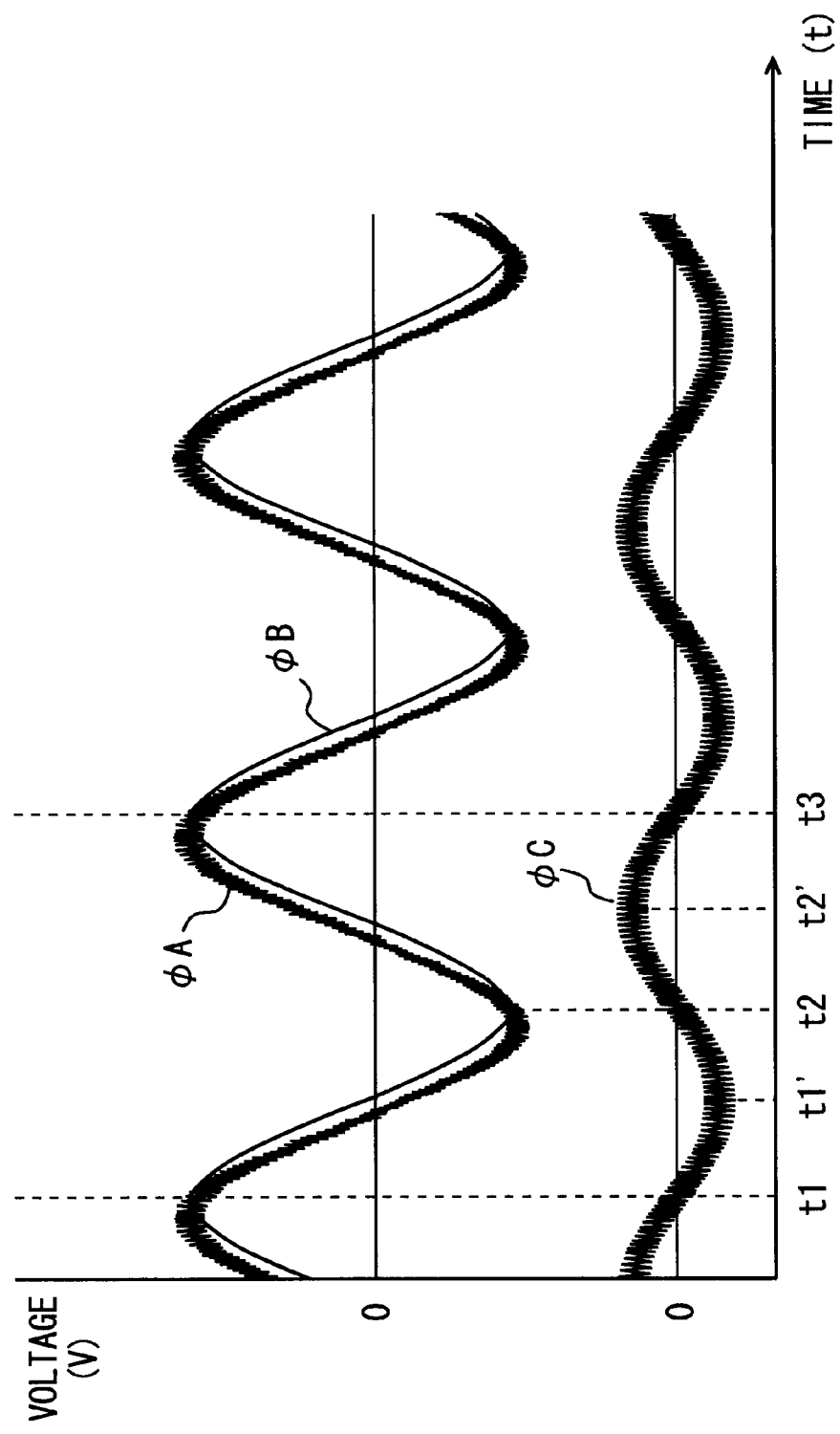
FIG. 3 is a waveform chart for use in illustration of the operation of the LPF shown in FIG. 1.

FIG. 3 is a waveform chart for use in illustration of the operation of the LPF 700.

Referring to FIG. 3, the axis of ordinate represents voltage V, and the axis of abscissa represents time t. The analog signal φA contains a high frequency component to be a cause of noise. Meanwhile, the output signal φB is removed of a high frequency component by the filter circuit 4.

As in the following Expression (1), the differential signal φC equals to the difference between the analog signal φA and the output signal φB and therefore contains the high frequency component to be a cause of noise.

$$\phi C = \phi A - \phi B \tag{1}$$

At time t1, the differential operation circuit 2 outputs the differential signal φC whose voltage value is zero. Based on Expression (1), from time t1 to t2, the differential signal φC is a negative function whose value is minimized at time t1'. Therefore, from time t1 to t2, the capacitor C1 is discharged. This causes the output signal φB to drop. Meanwhile, based on Expression (1), from time t2 to t3, the differential signal φC is a positive function whose value is maximized at time t2'. Therefore, from time t2 to t3, the capacitor C1 is charged. This causes the output signal φB to rise. The transition of the differential signal φC and the output signal φB after time t3 is the same as that from time t1 to t3, and therefore will not be described.

In this way, the differential operation circuit 2 allows the output signal φB output from the LPF 700 to have substantially the same phase and level (amplitude) as those of the analog signal φA. If the LPF 700 is not provided with the differential operation circuit 2, the capacitor C1 is saturated at the power supply voltage for the operational amplifier OP31. As a result, the LPF no longer performs normal circuit operation. In the LPF without the differential operation circuit 2, an output signal in a phase and a level different from the analog signal is output.

In other words, the LPF 700 allows the differential operation circuit 2 to calculate the differential value between the analog signal and the output signal, and therefore the necessary frequency band is not attenuated.

The LPF 700 further includes a filter circuit 4 between the differential operation circuit 2 and the output node N1. The voltage-current conversion circuit 3 has high resistance, so that the filter circuit 4 has a large time constant. Therefore, the high frequency component can sufficiently be removed from the output signal φB.

Figure 4:
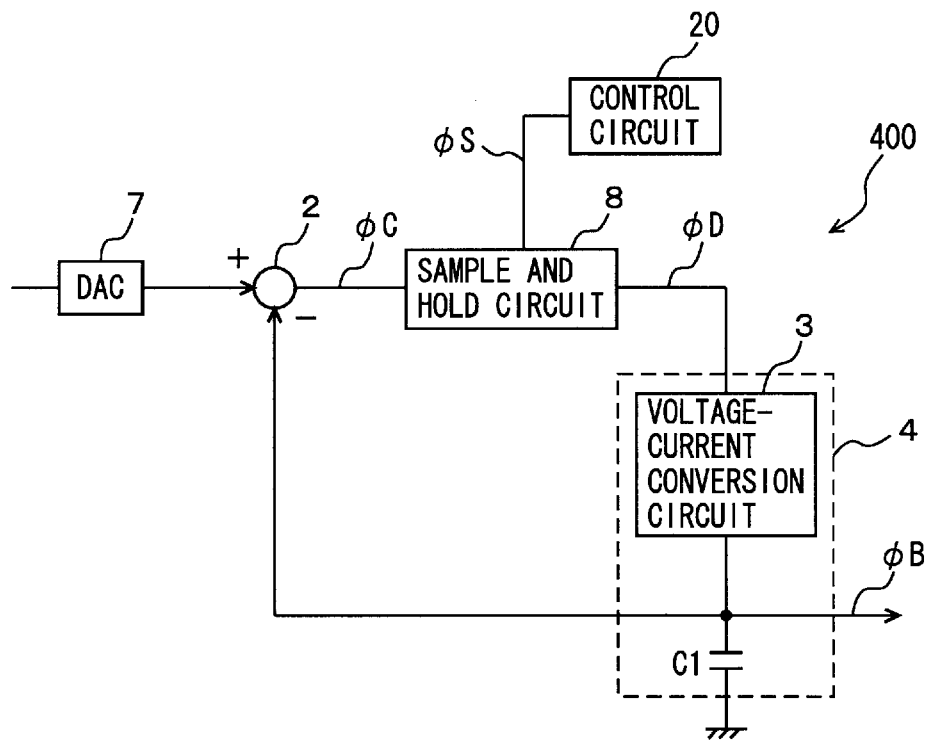
FIG. 4 is a diagram of the configuration of an LPF different from the LPF shown in FIG. 1.

FIG. 4 is a block diagram of the configuration of an LPF according to another embodiment of the invention.

Referring to FIG. 4, the LPF 400 includes a sample and hold circuit 8 and a control circuit 20 in addition to the configuration of the LPF 700. The control circuit 20 outputs a sampling signal φS to control the sample and hold circuit 8. The other part of the circuit configuration is the same as that of the LPF 700 and therefore will not be described.

Figure 5:
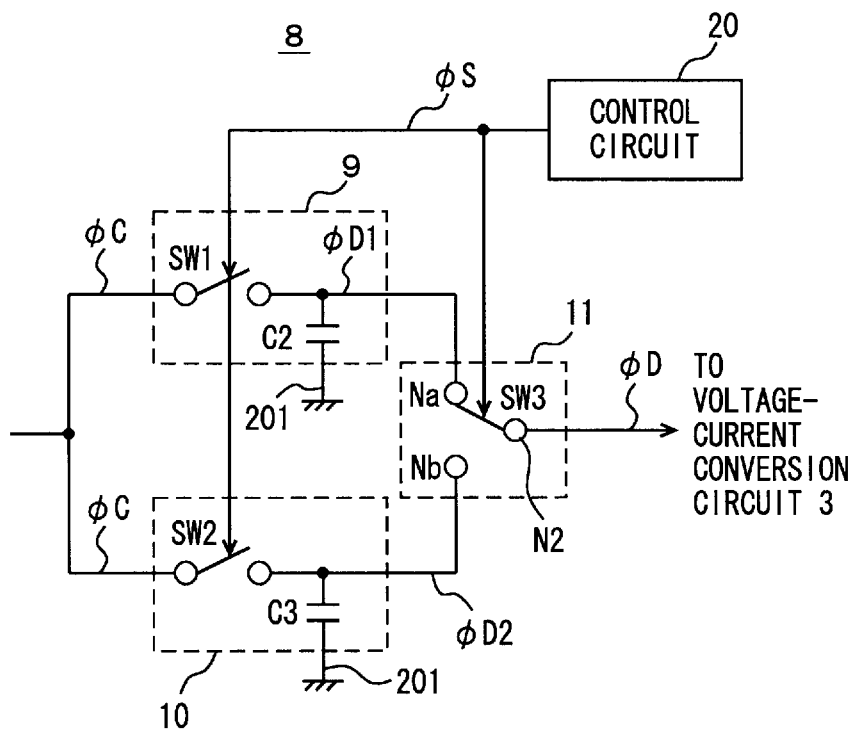
FIG. 5 is a circuit diagram showing in detail the configuration of the sample and hold circuit shown in FIG. 4.

FIG. 5 is a circuit diagram showing in detail the configuration of the sample and hold circuit 8 in FIG. 4.

Referring to FIG. 5, the sample and hold circuit 8 includes a first hold circuit 9, a second hold circuit 10 and a switch circuit 11.

The first and second hold circuits 9 and 10 are connected in parallel and have their input terminals both provided with the differential signal φC as an input. The first and second hold circuits 9 and 10 have their output terminals both connected to the switch circuit 11.

The first hold circuit 9 includes a switching element SW1 and a capacitor C2. The switching element SW1 is provided with the differential signal φC at its one end, and its other end is connected to the switch circuit 11. The capacitor C2 has its one end connected between the switching element SW1 and the switch circuit 11 and its other end connected to the ground potential node 201. When the sampling signal φS is in an H level, the switching element SW1 in the first hold circuit 9 is turned on, and charges are accumulated in the capacitor C2. When the sampling signal φS is in an L level, the switching element SW1 is turned off. The signal output from the first hold circuit 9 is designated as signal φD1.

The second hold circuit 10 includes a switching element SW2 and a capacitor C3. The switching element SW2 is provided with the differential signal φC at its one end, and its other end is connected to the switch circuit 11. The capacitor C3 has its one end connected between the switching element SW2 and the switch circuit 11 and its other end is connected to the ground potential node 201. When the sampling signal φS is in an L level, the switching element SW2 in the second hold circuit 10 is turned on, and charges are accumulated in the capacitor C3. When the sampling signal φS is in an H level, the switching element SW2 is turned off. The signal output from the second hold circuit 10 is designated as signal φD2.

The switch circuit 11 includes a switching element SW3. The switching element SW3 includes input nodes Na and Nb and an output node N2. When the sampling signal φS is in an L level, the input node Na and the output node N2 in the switching element SW3 are connected. When the sampling signal φS is in an H level, the input node Nb and the output node N2 are connected. The signal output from the switching element SW3 is designated as signal φD.

The operation of the LPF 400 having the above circuit configuration will be described.

Figure 6:
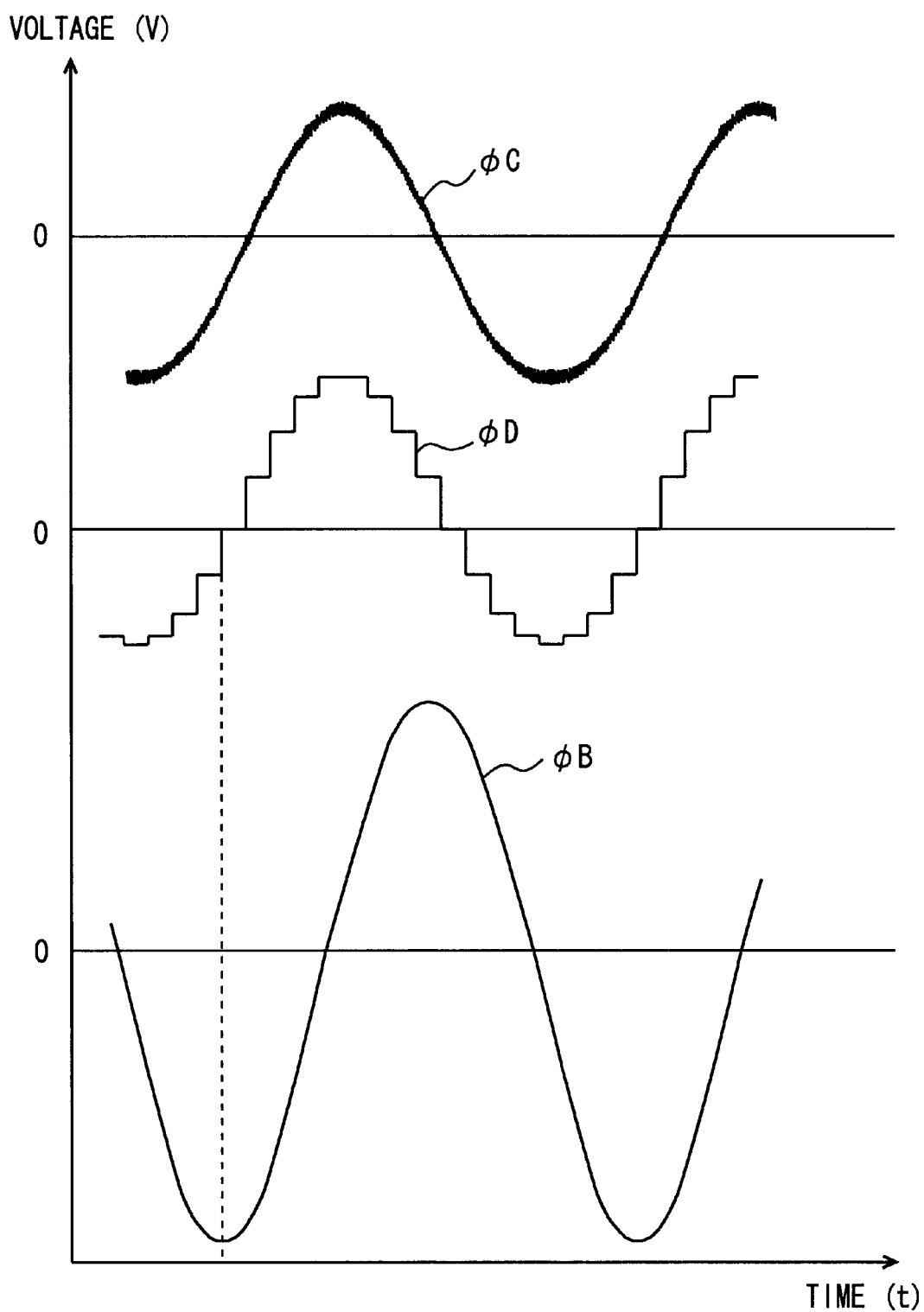
FIG. 6 is a waveform chart for use in illustration of the operation of the LPF shown in FIG. 4.

FIG. 6 is a waveform chart for use in illustration of the operation of the LPF 400 shown in FIG. 4.

The three waveforms shown in FIG. 6 represent the differential signal φC, the signal φD output from the sample and hold circuit 8, and the output signal φB.

As can be understood from Expression (1), the differential signal φC equals the difference between the analog signal φA output from the DAC 7 and the output signal φB. The analog signal φA contains a high frequency component to be a cause of noise, and therefore the differential signal φC also contains a high frequency component.

The sample and hold circuit 8 samples the differential signal φC at prescribed intervals in response to the sampling signal φS output from the control circuit 20 and holds the sampled voltage. As a result, the sample and hold circuit 8 outputs the signal φD in a stepped form as shown in FIG. 6.

Now, the operation of the sample and hold circuit 8 will be described.

Figure 7:
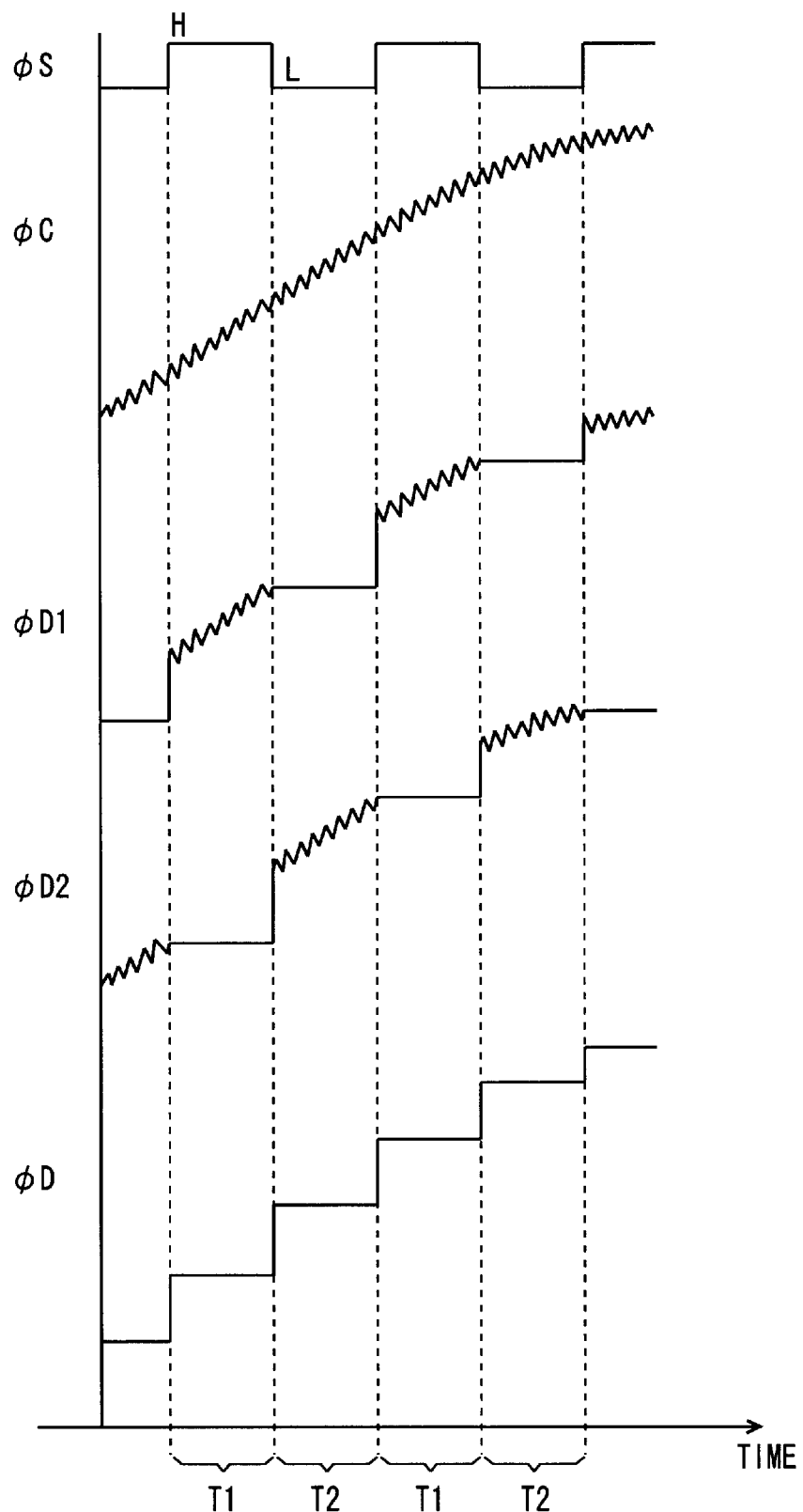
FIG. 7 is a waveform chart for use in illustration of the operation of the sample and hold circuit shown in FIG. 5.

FIG. 7 is a waveform chart for use in illustration of the operation of the sample and hold circuit 8 in FIG. 4. Referring to FIG. 7, the first and second hold circuits 9 and 10 are both provided with the differential signal φC.

In period T1, the sampling signal φS output from the control circuit 20 attains an H level. At the time, the switching element SW1 in the first hold circuit 9 is turned on. The capacitor C2 is therefore charged. As a result, the signal φD1 output from the first hold circuit 9 has a waveform equivalent to the signal φC. Meanwhile, as for the second hold circuit 10, in period T1, the switching element SW2 is turned off. The signal φD2 output from the second hold circuit 10 attains a voltage level based on charges accumulated in the capacitor C3 before period T1. As a result, the high frequency component contained in the differential signal φC is removed. The switch circuit 11 has its input node Nb and its output node N2 connected because the sampling signal φS is in the H level. Therefore, the switch circuit 11 outputs the signal φD2 output from the second hold circuit 10 as the output signal φD.

In period T2, the sampling signal φS attains an L level. At the time, the switching element SW1 in the first hold circuit 9 is turned off. The signal φD1 therefore attains a level of voltage charged in the capacitor C2 up to the moment immediately before period T2. As a result, the high frequency component contained in the differential signal φC is removed. Meanwhile, the switching element SW2 in the second hold circuit 10 is turned on, and the capacitor C3 is charged by the differential signal φC. The input node Na and the output node N2 are connected in the switch circuit 11. Then, the signal φD1 is output as the output signal φD.

Consequently, the switch circuit 11 outputs the hold voltage removed of the high frequency component as the output signal φD in periods T1 and T2. The signal φD output from the sample and hold circuit 8 therefore has a stepped waveform as shown in FIG. 6 or 7.

The sample and hold circuit 8 can control which high frequency component to remove from the differential signal φC depending on the frequency of the sampling signal φS output from the control circuit 20. More specifically, when for example the sampling signal φS is at 700 KHz, a signal at a higher frequency than 700 KHz is removed as the high frequency component.

Referring back to FIG. 4, the output signal φD output from the sample and hold circuit 8 is input to the filter circuit 4. The stepped waveform is then shaped into the smooth waveform of the output signal φB in the filter circuit 4.

Figure 8:
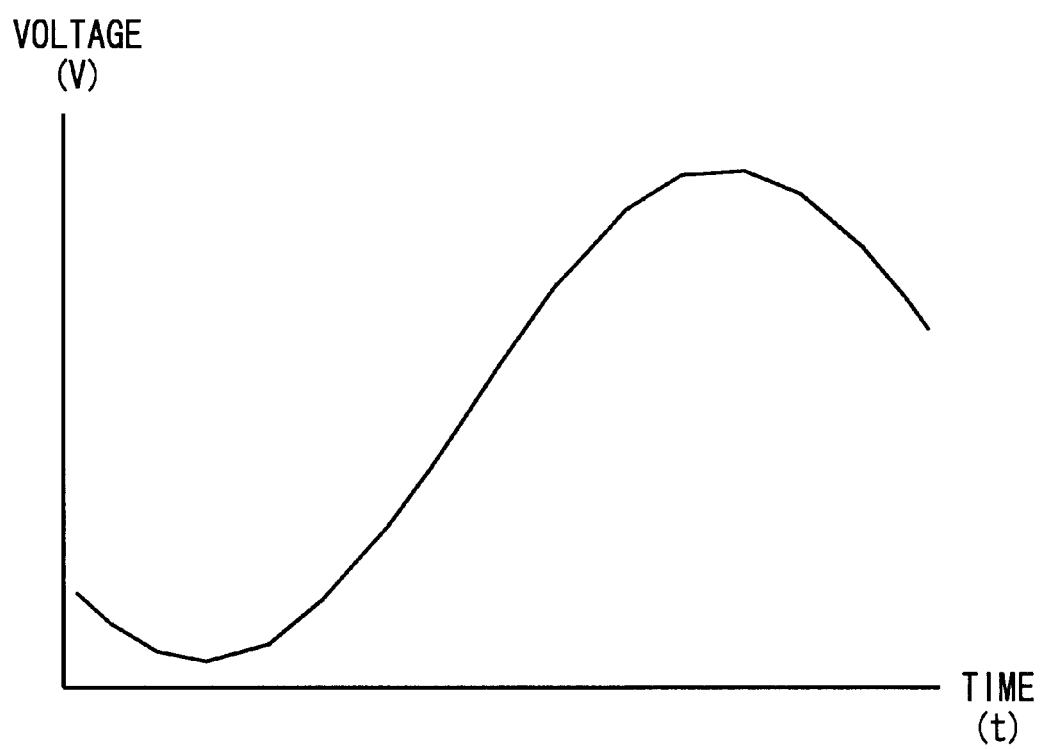
FIG. 8 is a waveform chart of the output signal of the LPF shown in FIG. 4.

At the time, the higher the sampling frequency is in the sample and hold circuit 8, the finer become the steps of the stepped waveform. As a result, the output signal φB output from the filter circuit 4 has a smooth waveform as shown in FIG. 8.

Figure 9:
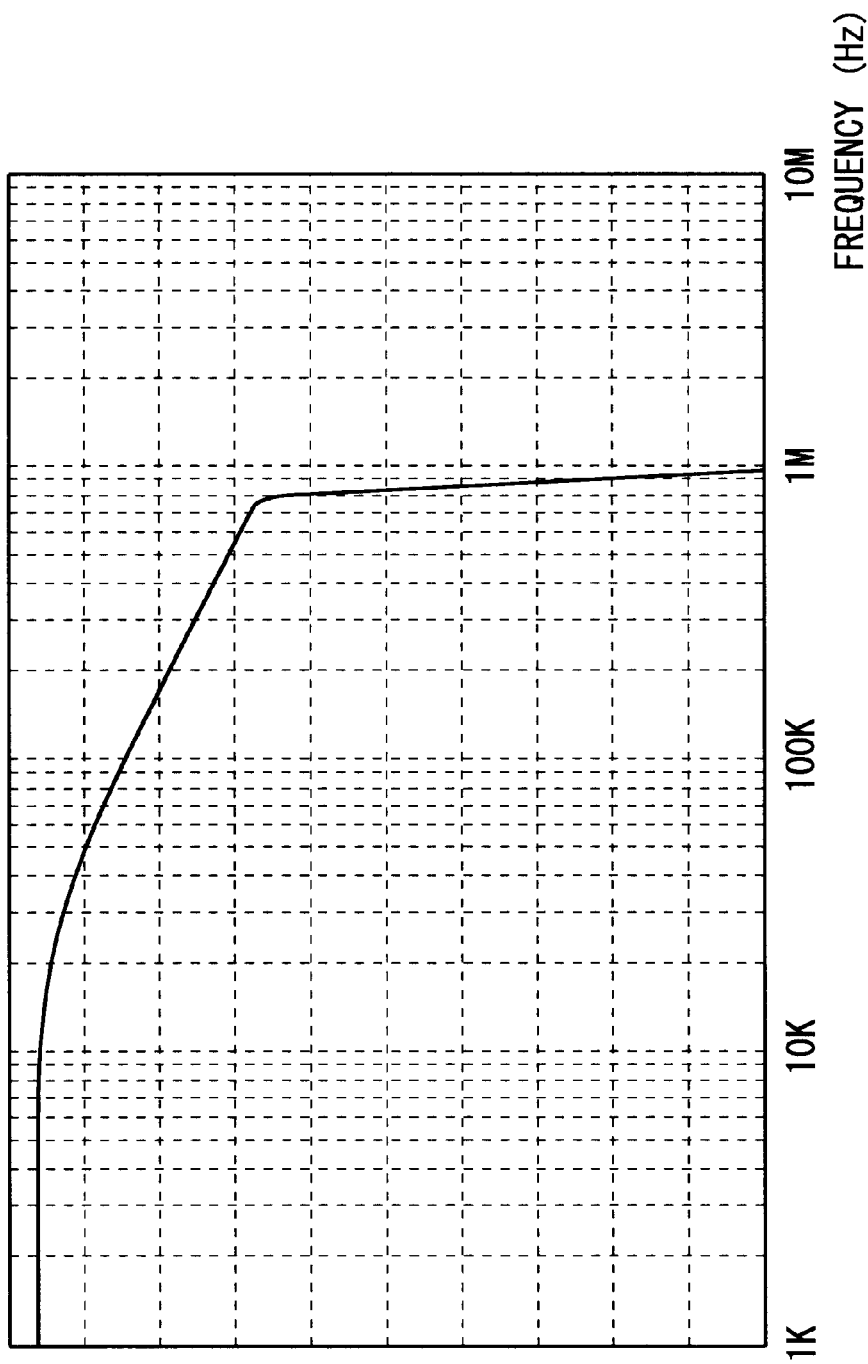
FIG. 9 is a graph showing the frequency characteristic of the output signal of the LPF shown in FIG. 4.

FIG. 9 is a graph showing the frequency characteristic of the LPF 400 shown in FIG. 4. Note that the sampling frequency in this case is 700 KHz. Referring to FIG. 9, the slope characteristic becomes steep around above 700 KHz. In other words, the LPF 400 shown in FIG. 4 can sufficiently remove a high frequency component that can be a cause of noise.

The LPF 400 according to the embodiment includes the two hold circuits 9 and 10 in the sample and hold circuit 8. In this way, while one hold circuit outputs voltage held by it, the other hold circuit can sample a signal. Therefore, when the sampling period for the voltage of the differential signal φC is shortened, the voltage value can accurately be sampled. Note that there are these two hold circuits in FIG. 5, while more than two hold circuits may be provided to shorten the sampling period and carry out more accurate sampling. In this case, the number of input nodes of the switch circuit 11 is equal to the number of hold circuits to be provided.

Figure 10:
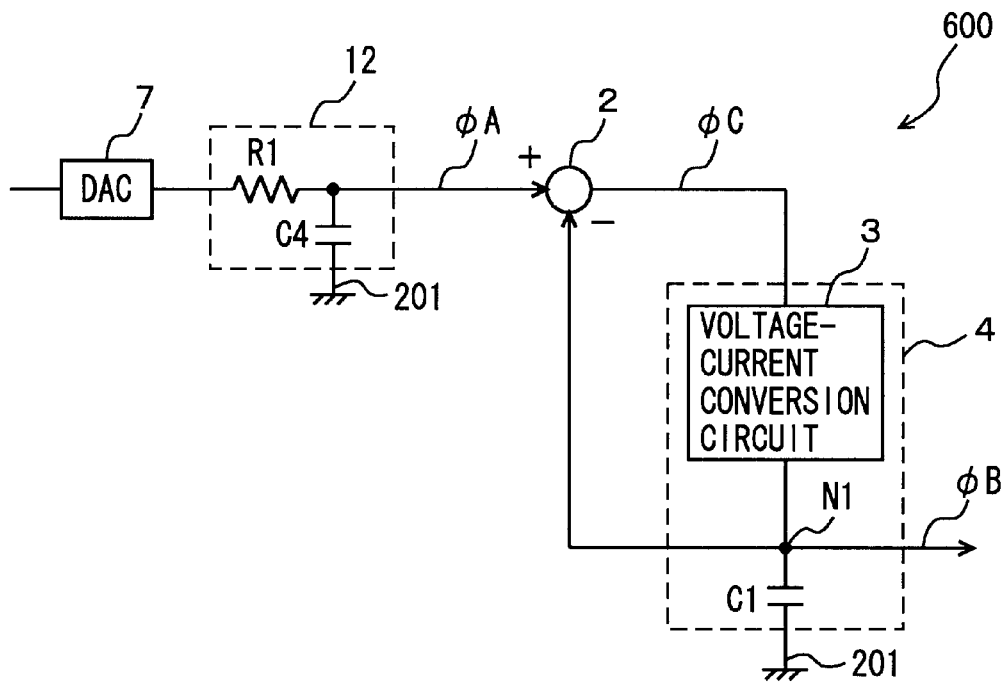
FIG. 10 is a circuit diagram of the configuration of an LPF according to another embodiment of the invention.

FIG. 10 is a circuit diagram of the configuration of an LPF according to another embodiment of the invention.

Referring to FIG. 10, the LPF 600 includes a filter circuit 12 in addition to the configuration of the LPF 700. The filter circuit 12 is connected between the DAC 7 and the differential operation circuit 2. The other part of the configuration is the same as that shown in FIG. 1 and therefore will not be described.

The LPF 600 includes the filter circuits 12 and 4. The LPF 600 is therefore a secondary filter circuit. In general, the LPF can have steeper slope characteristics for higher orders. Therefore, the LPF 600 can more thoroughly remove the high frequency component that can be a cause of noise.

Figure 11:
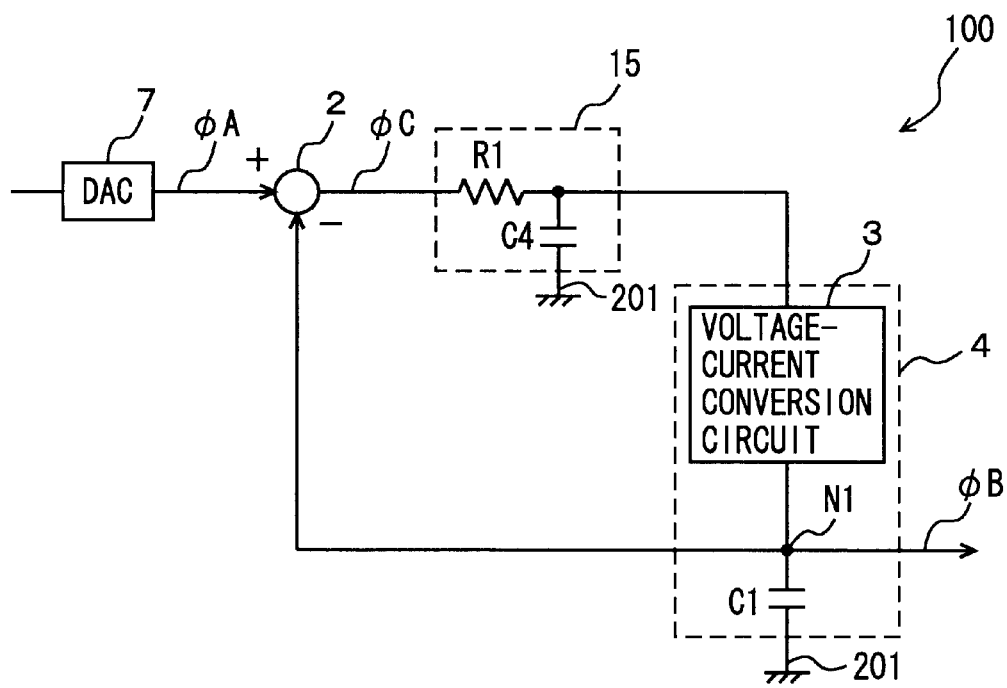
FIG. 11 is a circuit diagram of the configuration of an LPF according to another embodiment of the invention.

FIG. 11 is a circuit diagram of the configuration of an LPF according to another embodiment of the invention. Referring to FIG. 11, the LPF 100 includes a differential operation circuit 2, a voltage-current conversion circuit 3, a filter circuit 15, and a capacitor C1.

The filter circuit 15 is connected between the differential operation circuit 2 and the voltage-current conversion circuit 3. The other part of the circuit configuration is the same as that shown in FIG. 1 and therefore will not be described.

Now, the operation of the filter circuit 15 in the LPF 100 will be described.

To begin with, the difference in the frequency characteristic between the LPF 100 in FIG. 11 and the LPF 600 will be described. Note that the LPF 600 has the filter circuit 12 inserted before the differential operation circuit 2 as shown in FIG. 10.

Figure 12:
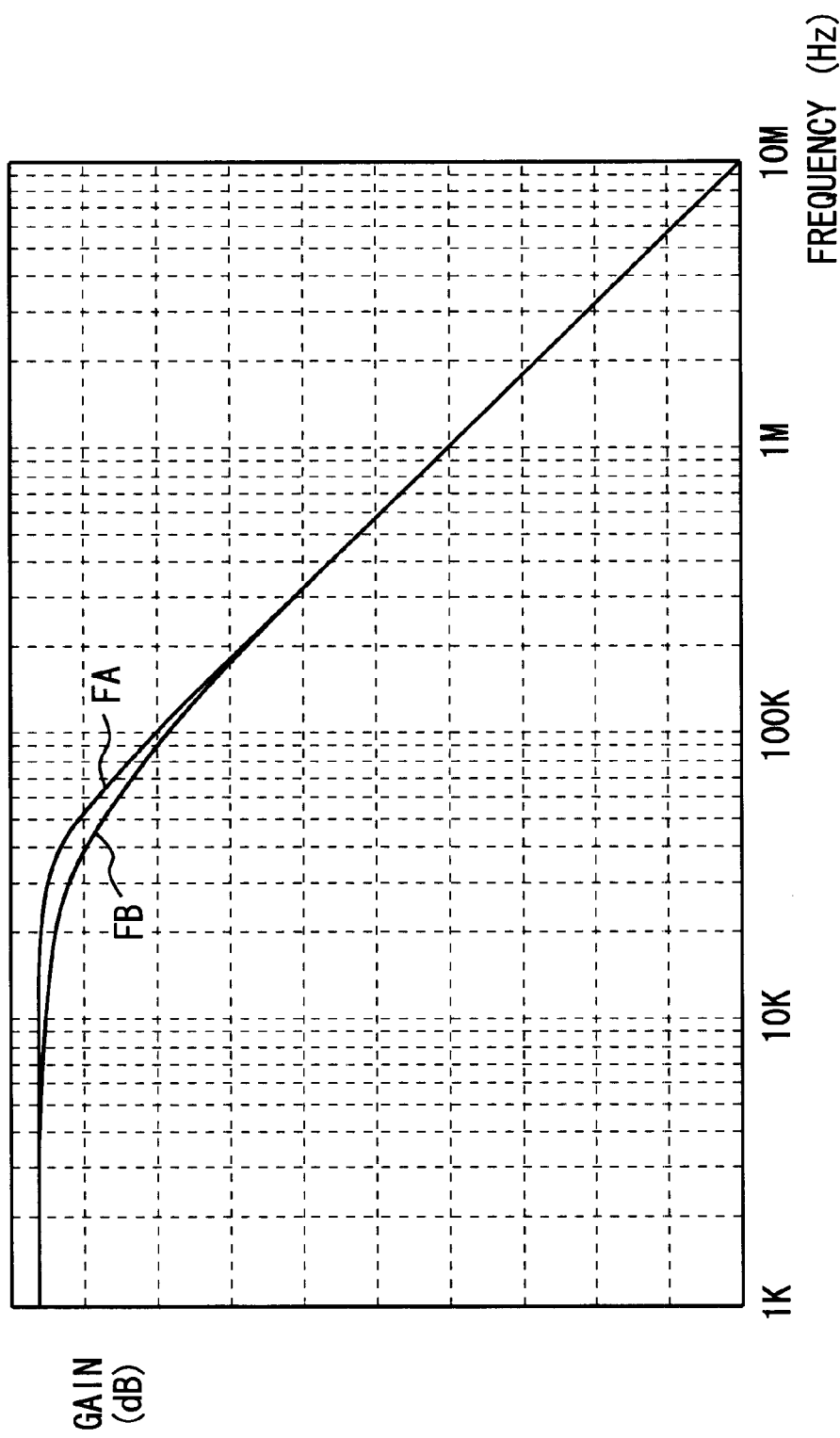
FIG. 12 is a graph showing the frequency characteristics of the LPFs shown in FIGS. 10 and 11.

FIG. 12 is a graph showing the frequency characteristics of the LPF 100 and the LPF 600.

The frequency characteristic of the LPF 100 is denoted by FA and the frequency characteristic of LPF 600 is denoted by FB.

As shown in FIG. 12, the slope characteristics of the frequency characteristics FA and FB are substantially equal. This is because the LPF 100 and the LPF 600 both form a secondary filter.

However, the attenuation in the passband gain in the frequency characteristic FA is smaller than that in the frequency characteristic FB. This is for the following reason.

A quality factor (hereinafter referred to as "Q value") defines the frequency characteristic of an LPF. When the Q value is raised, electrical signals in the passband in the frequency characteristic are amplified. Therefore, when the Q value can be raised as desired, the attenuation in the passband gain in the frequency characteristic can be restrained.

The transfer function Av of the LPF is generally represented by the following expression:

$$Av = \frac{H\omega_0^2}{s^2 + \frac{\omega_0}{Q}s + \omega_0^2} \tag{2}$$

where s is the Laplacian transformation properties, $107_0$ is the cutoff frequency, Q is the Q value, and H is the gain factor. In the following calculations, H=1.

When the voltage of the analog signal φA is Vi and the voltage of the output signal φB is $V_0$, the transfer function $Av_{100}$ of the LPF 100 is given by the following expression:

$$Av_{100} = \frac{Vo}{Vi} = \frac{\frac{G}{R_1 C_4 C_1}}{s^2 + \frac{1}{R_1 C_4}s + \frac{G}{R_1 C_4 C_1}} \tag{3}$$

where $R_1$ is the resistance value of the resistance element R1, $C_1$ the capacitance of the capacitor C1, $C_4$ the capacitance of the capacitor C4, and G the voltage-current conversion constant of the voltage-current conversion circuit 3.

From Expressions (2) and (3), the Q value $Q_{100}$ of the LPF 100 is given by the following expression:

$$Q_{100} = \sqrt{\frac{R_1 C_4 G}{C_1}} \quad (4)$$

From Expression (4), the Q value of the LPF 100 can be raised depending on the combination of the resistance $R_1$, the capacitance $C_1$, $C_4$ and the voltage-current conversion constant G.

The transfer function $Av_{600}$ of the LPF 600 is given by the following expression:

$$Av_{600} = \frac{Vo}{Vi} = \frac{\frac{G}{R_1 C_4 C_1}}{s^2 + \frac{G\left(R_1 C_4 + \frac{C_1}{G}\right)}{R_1 C_4 C_1}s + \frac{G}{R_1 C_4 C_1}} \quad (5)$$

$$\omega_0 = \sqrt{\frac{G}{R_1 C_4 C_1}}$$

From Expressions (2) and (5), the Q value $Q_{600}$ of the LPF 600 is given by the following expression:

$$Q_{600} = \frac{\sqrt{R_1 C_4 C_1 G}}{C_1 + R_1 C_4 G} = \sqrt{\frac{R_1 C_4 C_1 G}{2R_1 C_4 C_1 G + (R_1 C_4 G)^2 + C_1^2}} \quad (6)$$

From Expression (6), the Q value of the LPF 600 is not larger than $1/\sqrt{2}$ by any combination of $R_1$, $C_1$, $C_4$, and G.

In this way, the Q value of the LPF 100 having the filter circuit 15 inserted after the differential operation circuit 2 can be higher than that of the LPF 600 having the filter circuit 12 inserted before the differential operation circuit 2. Therefore, the attenuation in the passband gain in the frequency characteristic FA can be more restrained than that in the frequency characteristic FB.

Now, the difference in the frequency characteristic between the LPF 100 shown in FIG. 11 and the LPF 700 will be described. The LPF 700 has a configuration equivalent to the configuration the LPF 100 as shown in FIG. 1 excluding the filter circuit 15.

Figure 13:
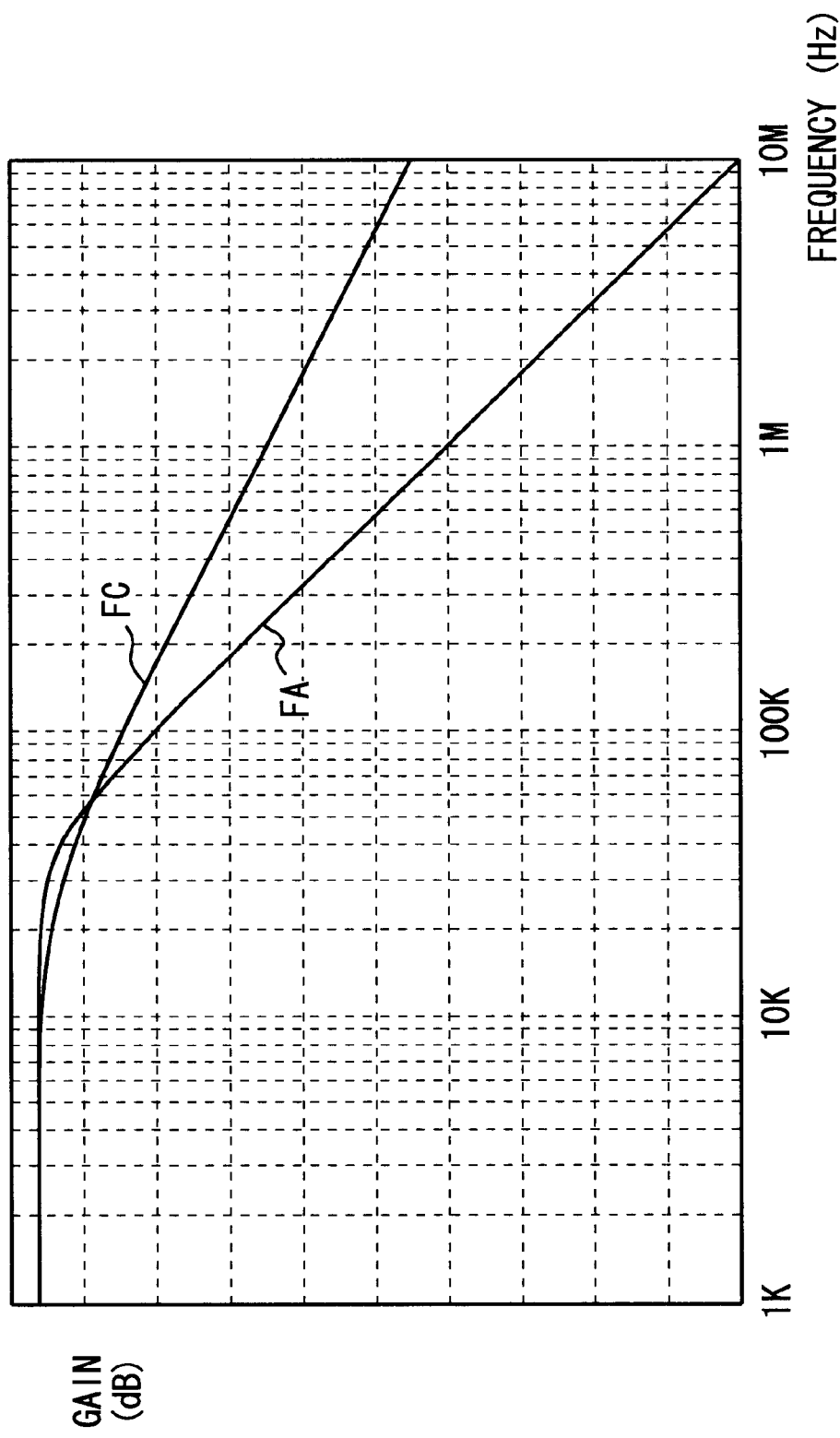
FIG. 13 is a graph showing the frequency characteristics of the LPFs shown in FIGS. 10 and 1.

FIG. 13 is a graph showing the frequency characteristics of the LPFs 100 and 700.

Referring to FIG. 13, the LPF 700 is a primary filter, while the LPF 100 is a secondary filter and therefore the frequency characteristic FA of the LPF 100 has a steeper slope characteristic than the frequency characteristic FC of the LPF 700.

In the frequency characteristic FA, the attenuation in the passband gain is more restrained than in the frequency characteristic FC. This is because the primary filter, LPF 700 cannot control the passband gain in the frequency characteristic, but the secondary filter, LPF 100 can raise the Q value and restrain the passband gain in the frequency characteristic.

In this way, the LPF 100 having the filter circuit 15 after the differential operation circuit 2 can restrain the attenuation in the passband gain in the frequency characteristic. Consequently, the LPF 100 can remove the high frequency component to be a cause of noise.

Figure 14:
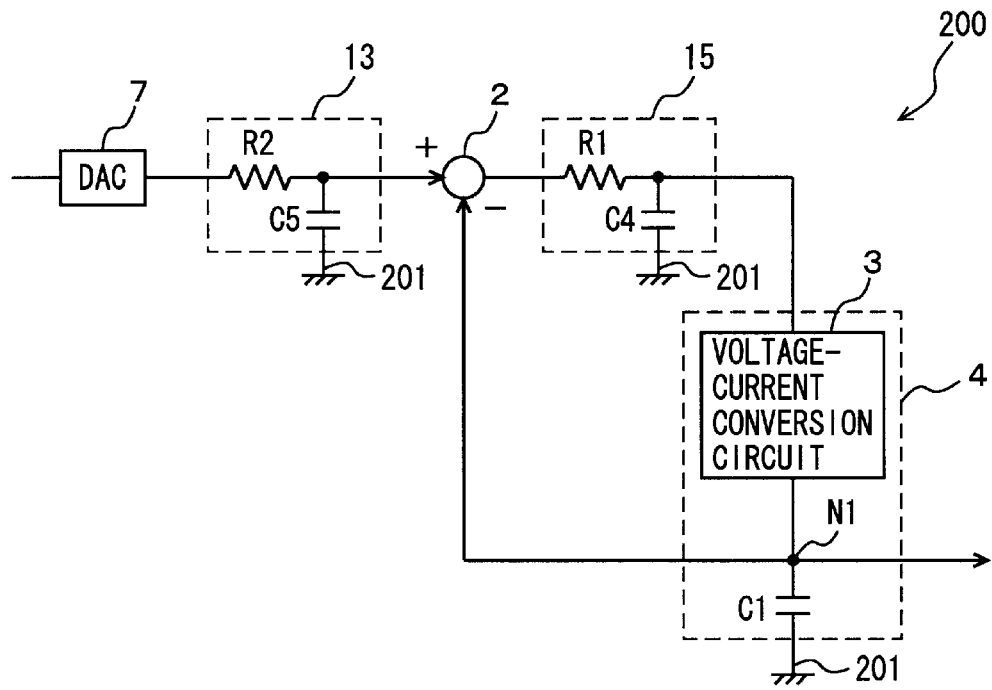
FIGS. 14 to 16 are circuit diagrams of the configurations of LPFs according to other embodiments of the invention.

FIG. 14 is a circuit diagram of the configuration of an LPF according to another embodiment of the invention.

Referring to FIG. 14, the LPF 200 includes a filter circuit 13 between the DAC 7 and the differential operation circuit 2 in addition to the configuration of the LPF 100. The filter circuit 13 includes a resistance element R2 and a capacitor C5. The resistance element R2 is connected between the DAC 7 and the differential amplifier circuit 2. The capacitor C5 has its one end connected between the resistance element R2 and the differential operation circuit 2 and its other end connected to the ground potential node 201. The other part of the configuration is the same as that of the LPF 100 and will not be described.

The LPF 200 is a tertiary filter, in other words, a higher order filter than the LPF 100. The frequency characteristic of the LPF 200 has a steeper slope than that of the frequency characteristic of the LPF 100, and a higher frequency component can be removed.

Figure 15:
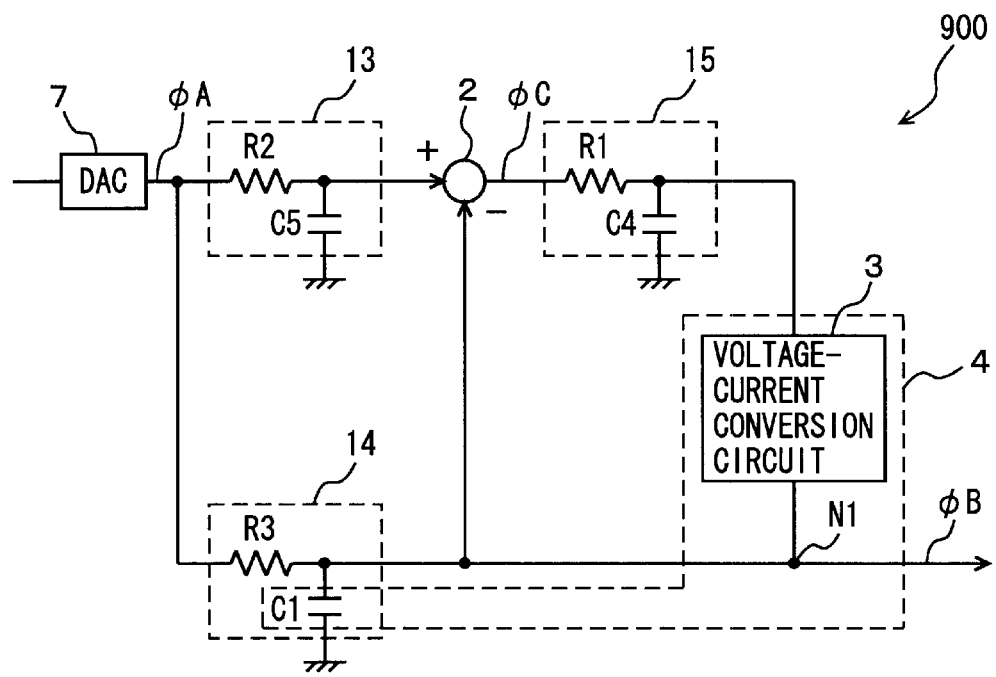

FIG. 15 is a circuit diagram of the configuration of an LPF according to another embodiment of the invention.

Referring to FIG. 15, the LPF 900 includes a filter circuit 14 between the DAC 7 and the output node N1 in addition to the configuration of the LPF 200. The other part of the circuit configuration is the same as that of the LPF 200.

The filter circuit 14 includes a resistance element R3 and a capacitor C1. Note that the filter circuit 14 and the filter circuit 4 share the capacitor C1.

Now, the operation of the LPF 900 will be described.

The differential signal φC output from the differential operation circuit 2 is converted into a current value by the voltage-current conversion circuit 3, and the capacitor C1 is charged (or discharged). Since the filter circuit 14 and the filter circuit 4 share the capacitor C1, the output signal φB is produced as the sum of the output signal of the filter circuit 14 and the output signal of the filter circuit 4. Then, the sum is fed back to the differential operation circuit 2.

The time constant of the filter circuit 14 is larger than that of the filter circuit 13. The filter circuit 14 therefore has greater capability of removing the high frequency component. The output signal of the filter circuit 14 is added to the output signal of the filter circuit 4 and the sum is output as the output signal φB from the LPF 900. This allows the high frequency component to be removed from the output signal φB. When the time constant is larger, a necessary frequency band could be attenuated as well, but the differential operation circuit 2 produces the difference between the output signal of the filter circuit 13 and the output signal φB and the capacitor C1 is charged (or discharged) based on the differential value, so that the necessary frequency band can be prevented from being attenuated.

In addition, the LPF 900 has a higher filter order and may have a steeper slope characteristic.

Figure 16:
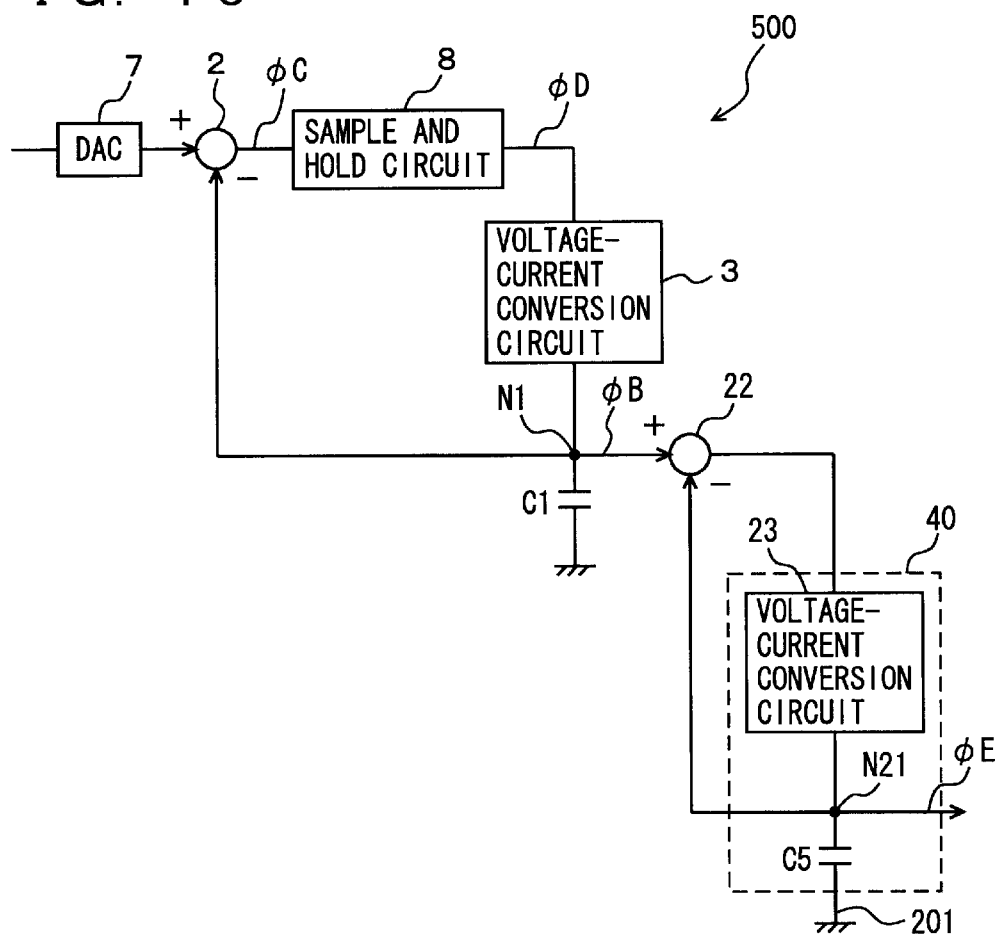
Figure 17:
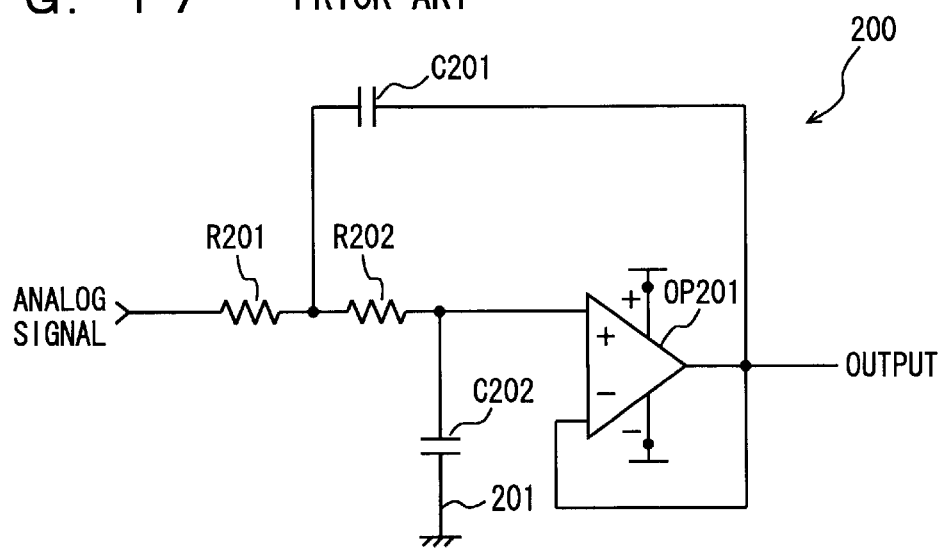
FIG. 17 is a circuit diagram of the configuration of an LPF in a conventional audio apparatus.
Figure 18:
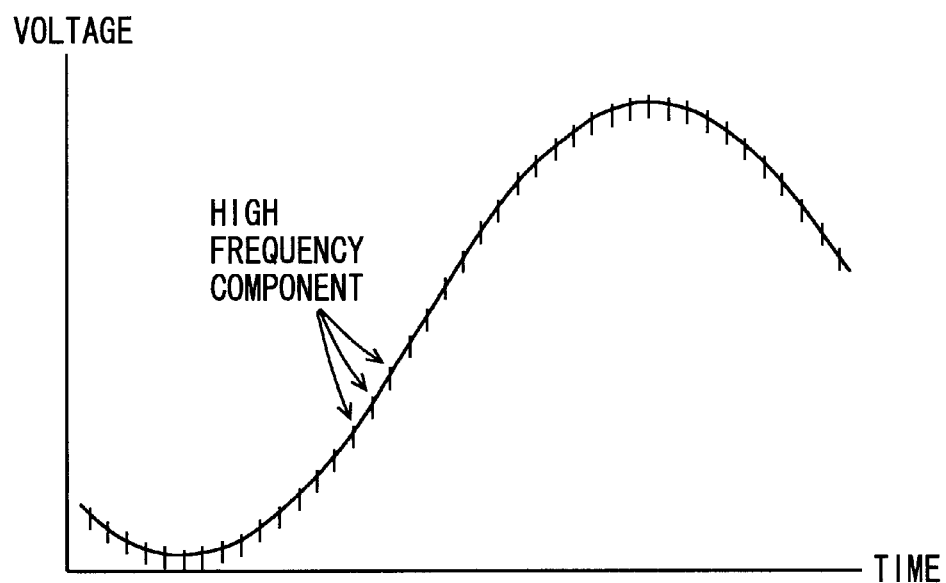
FIG. 18 is a waveform chart of the output signal of the LPF shown in FIG. 17.

FIG. 16 is a diagram of the configuration of an LPF according to another embodiment of the invention. Referring to FIG. 16, the LPF 500 includes a differential operation circuit 22, a voltage-current conversion circuit 23 and a capacitor C5 in addition to the configuration of the LPF 400 shown in FIG. 4.

The differential operation circuit 22 is connected between the node N1 and the voltage-current conversion circuit 23. The capacitor C5 has its one end connected to the output terminal of the voltage-current conversion circuit 23 and its other end connected to the ground potential node 201. The voltage-current conversion circuit 23 and the capacitor C5 form a filter circuit 40. The LPF 500 outputs an output signal φE from the output node N21. Node N21 is the connection node of the voltage-current conversion circuit 23 and the capacitor C5. The differential operation circuit 22 outputs the differential value between the output signals φB and φE from the node N1. The other part of the configuration is the same as that of the LPF 400 and will not be described.

The LPF 500 as described above generates an output signal φB removed of a high frequency component by the sample and hold circuit 8. In addition, with the filter circuit 40, the vector shaped output signal φB is shaped into a very smooth output signal φE. The LPF can remove the high frequency component with the sample and hold circuit, but when the sampling frequency of the sampling signal φS is low, the waveform of the output signal φB might not be smooth. When the output signal φB must be smoothed in a case as this, the LPF 500 can remove the high frequency component and then shape the waveform of the output signal into a smooth form.

Although the embodiments of the invention have been described, they are simply by way of illustration and examples only and are not to be taken by way of limitation. The described embodiments may be subjected to various modifications without departing from the scope of the invention.

What is claimed is:

1. A low-pass filter attenuating a high frequency component of an input signal and outputting a low frequency component of the input signal as an output signal, comprising:
    a differential operation circuit subtracting said output signal from said input signal and outputting a differential signal;
    a voltage-current conversion circuit converting voltage of said differential signal output from said differential operation circuit into current; and
    a capacitance element accumulating charges in current received from said voltage-current conversion circuit, to generate said output signal.

2. The low-pass filter according to claim 1, further comprising:
    a first filter circuit attenuating a high frequency component of said differential signal output from said differential operation circuit and outputting a low frequency component of said differential signal to be supplied to said voltage-current conversion circuit.

3. The low-pass filter according to claim 2, further comprising:
    a second filter circuit attenuating a high frequency component of said input signal and outputting a low frequency component of the input signal,
    said differential operation circuit subtracting said output signal from the low frequency component of said input signal output from said second filter circuit to output said differential signal.

4. A low-pass filter attenuating a high frequency component of an input signal and outputting a low frequency component of the input signal as an output signal, comprising:
    a differential operation circuit subtracting said output signal from said input signal and outputting a differential signal;
    a sample and hold circuit sampling and holding the differential signal output from said differential operation circuit;
    a voltage-current conversion circuit converting voltage output from said sample and hold circuit into current; and
    a capacitance element accumulating charges in current received from said voltage-current conversion circuit to generate said output signal.

5. The low-pass filter according to claim 4, wherein said sample and hold circuit includes:
    a plurality of sample and hold units sampling and holding said differential signal in different timings from each other; and
    a switch circuit sequentially switching the outputs of said plurality of sample and hold units.

6. A low-pass filter, comprising:
    a first low-pass filter circuit attenuating a high frequency component of an input signal and outputting a low frequency component of the input signal; and
    a second low-pass filter circuit attenuating a high frequency component of the output signal from said first low-pass filter circuit and outputting a low frequency component of the output signal,
    said first low-pass filter circuit including:
        a first differential operation circuit subtracting the output signal of said first low-pass filter circuit from said input signal and outputting a differential signal;
        a sample and hold circuit sampling and holding the differential signal output from said first differential operation circuit;
        a first voltage-current conversion circuit converting voltage output from said sample and hold circuit into current; and
        a first capacitance element accumulating charges in current received from said first voltage-current conversion circuit to generate the output signal of said first low-pass filter circuit,
    said second low-pass filter circuit including:
        a second differential operation circuit subtracting the output signal of said second low-pass filter circuit from the output signal of said first low-pass filter circuit and outputting a differential signal;
        a second voltage-current conversion circuit converting voltage output from said second differential operation circuit into current; and
        a second capacitance element accumulating charges in current received from said second voltage-current conversion circuit to generate the output signal of said second low-pass filter circuit.

* * * * *